United States Patent [19]

Bailey et al.

[11] Patent Number: 5,225,965
[45] Date of Patent: Jul. 6, 1993

[54] HEAT SINK LOAD SPRING ASSEMBLY

[75] Inventors: Terry G. Bailey, Huntsville; Joseph T. Betterton, Arab; Robert T. Choat, Madison; Gerald K. Oden, Huntsville, all of Ala.

[73] Assignee: Chrysler Corporation, Highland Park, Mich.

[21] Appl. No.: 874,249

[22] Filed: Apr. 24, 1992

[51] Int. Cl.$^5$ .............................................. H05K 7/20
[52] U.S. Cl. .................................. 361/386; 165/80.3; 174/16.3; 257/726; 257/727; 361/388
[58] Field of Search .............................. 165/80.3, 185; 174/16.3; 267/158–164, 181; 357/79, 81; 361/383, 386–389, 395, 399, 417–420, 427

[56] References Cited

U.S. PATENT DOCUMENTS

| 4,096,547 | 6/1978 | Calabro | 361/388 |
| 4,845,590 | 7/1989 | Mikolajczak | 174/16.3 |
| 4,923,179 | 5/1990 | Mikolajczak | 174/16.3 |
| 4,972,294 | 11/1990 | Moses, Jr. et al. | 361/386 |

Primary Examiner—Gregory D. Thompson
Attorney, Agent, or Firm—Mark P. Calcaterra

[57] ABSTRACT

A load spring for heat sink assemblies has elongated body with a plurality of fingers and a wedge member positioning the spring with respect to a wall of a heat sink housing. The fingers apply a force onto the electrical components to clamp the electrical components against the heat sink housing to provide heat dissipation from the electrical components to the housing.

10 Claims, 2 Drawing Sheets

HEAT SINK LOAD SPRING ASSEMBLY

BACKGROUND AND SUMMARY OF THE INVENTION

The present invention relates to load springs and, more particularly, to load springs which enable retention of electrical components within heat sink assemblies. The load springs securely clamp the electrical components against the heat sink housing to dissipate heat from the electrical components to the housing.

In electronic modules, various electrical components generate amounts of heat which cannot be adequately dissipated to the ambient surroundings without the utilization of a heat sink. Printed circuit boards are used to provide a support for the electrical conductors and the associated electrical components, generally solid state devices, that make up the electronic module. In order to have an effective transfer of heat from the solid state devices to the heat sink, the solid state devices must be securely clamped to the heat sink. It is also desirable to have the solid state devices mounted to the heat sink with a device that permits easy installation upon the heat sink and also with the associated circuit board. Further, it is desirable to have the solid state devices (heat generating devices), in close proximity to the associated circuit board so as to minimize the length of the conductors required for connecting the solid state devices to the circuit board.

Springs have been utilized to retain electrical components within heat sink housings. Springs like those illustrated in U.S Pat. Nos. 4,845,590, issued Jul. 4, 1989 and 4,891,735, issued Jan. 2, 1990, both assigned to the assignee of the present invention, the specifications of which are herein expressly incorporated by reference, show spring devices utilized to retain electrical devices within a housing. While these springs function satisfactorily for their intended purpose, designers are always striving to improve the art.

Accordingly, it is an object of the present invention to provide an improved load spring to secure electrical components with heat sink tabs against a heat sink housing. A load spring is provided which may easily be installed with a carrier and heat sink housing by an automated process. The load spring provides a clamping force which applies a desired retention force on the electrical components to maintain them against the housing wall. Also, the load spring includes a wedge mechanism which may be associated with a wall of the heat sink housing to ensure retention of the load spring with respect to the housing.

From the subsequent description and claims taken in conjunction with the accompanying drawings, other objects and advantages of the present invention will become apparent to those skilled in the art.

DETAILED DESCRIPTION OF THE PREFERRED EMBODIMENT

Figure 1:
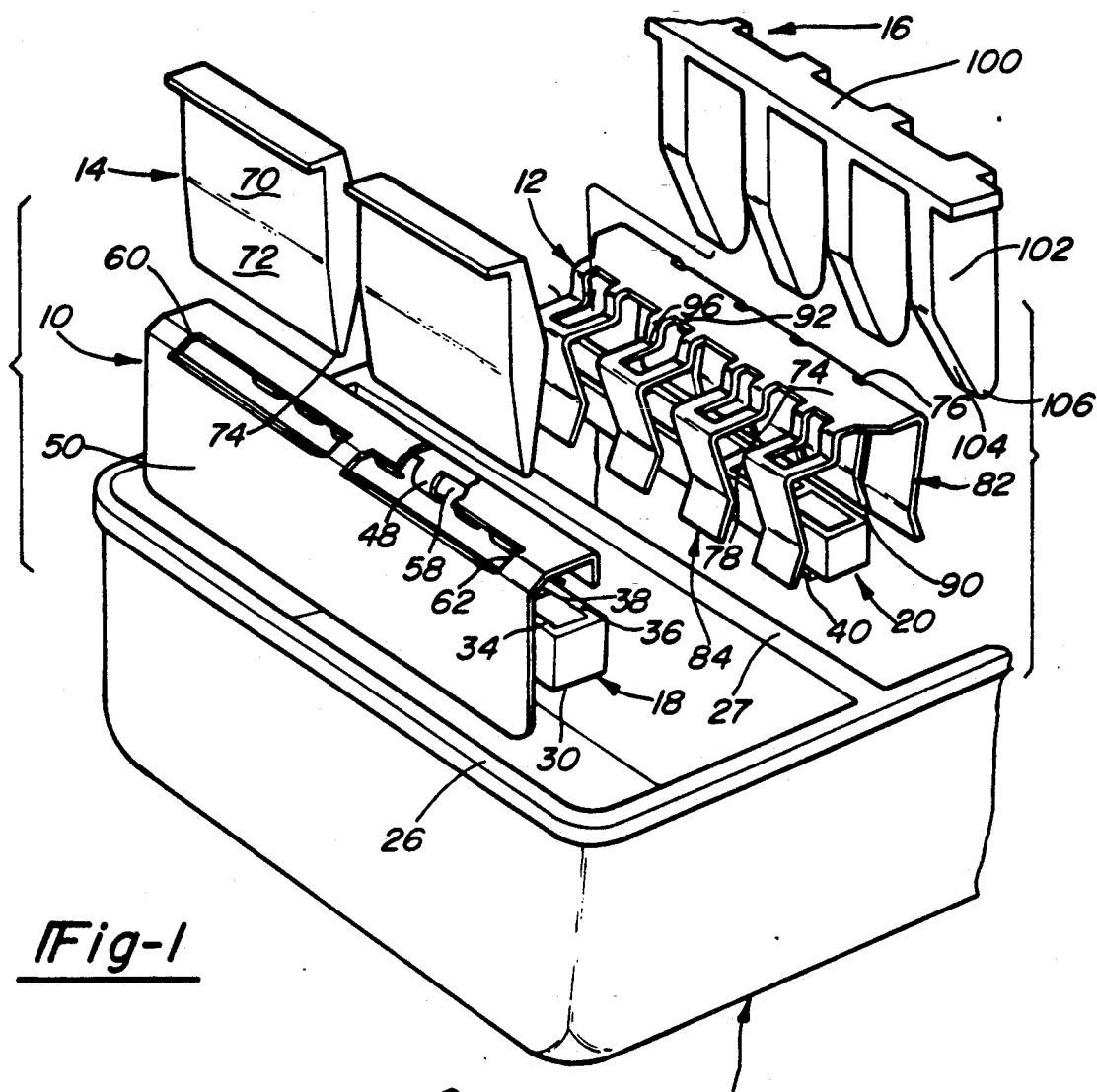
FIG. 1 is an exploded perspective view of load springs of the present invention and heat sink housing.
Figure 2:
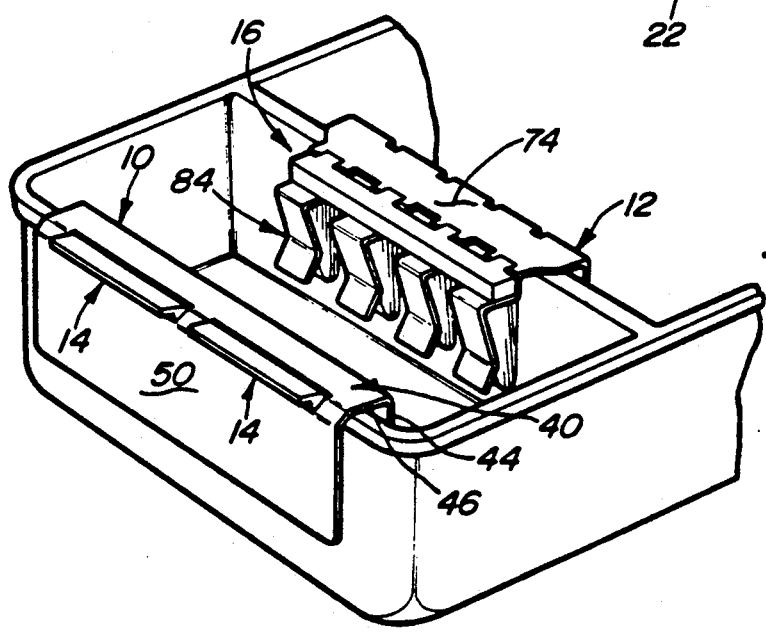
FIG. 2 is an assembled perspective view of the load springs of FIG. 1.
Figure 3:
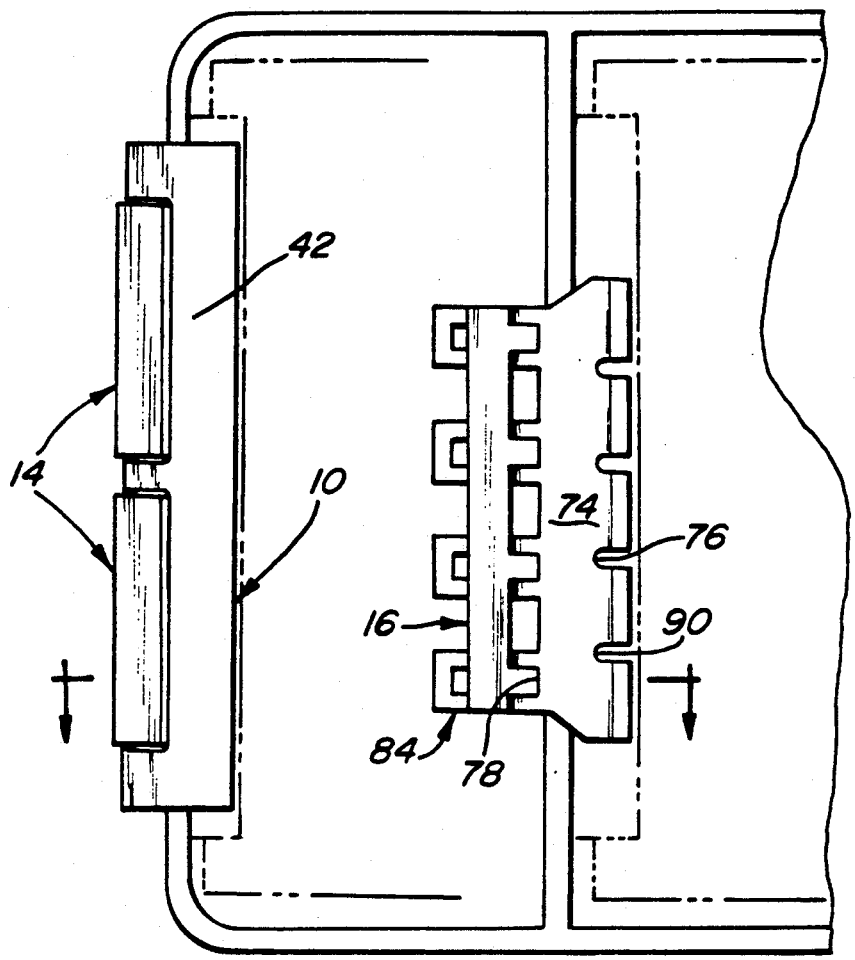
FIG. 3 is a plan view of FIG. 2.
Figure 4:
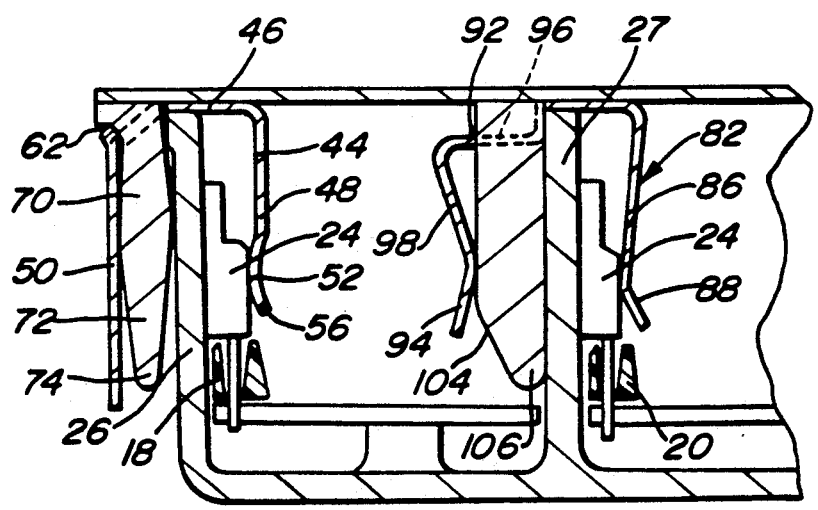
FIG. 4 is a sectional view of the load springs, the section being taken along line 4—4 of FIG. 3.

Referring to the figures, particularly FIG. 1, load springs in accordance with the present invention are illustrated and designated with the reference numerals 10 and 12. The load springs 10 and 12 in FIG. 1 are illustrated with wedge members 14 and 16, carrier members 18 and 20 and a heat sink housing 22. The load springs 10 and 12 are assembled with the wedges 14 and 16, carriers 18 and 20 and housing 22 to secure electrical components 24 against the housing 22 to dissipate heat from electrical components 24 to the heat sink housing 22, as seen in FIGS. 2 through 4. The housing 22 includes walls 26 and 27 which provide a heat sink surface for the electrical components 24.

The carrier members 18 and 20 include a base 30 in the shape of an elongated rectangular bar. A plurality of apertures 32 are formed in the base to receive conductors from the electrical components 24. A plurality of walls 34, 36 and 38 extend from the base 30 to form individual receiving receptacles for the electrical components 24. Walls 38 run perpendicular to walls 34 and 36 to form the receptacles. Also, the base 30 includes posts 40 to secure the carriers 18 and 20 to a circuit board.

Load spring 10 includes an elongated body member 42 having an overall L-shape in end elevation with first and second leg portions 44 and 46. The leg portions 44 and 46 are substantially planar, perpendicular to and continuous with one another. The first leg member 44 includes a plurality of extending biasing finger members 48. The second leg portion 46 includes an extending flange 50. The load spring 10 is unitarily formed or stamped from a spring steel material and may be stamped, rolled, formed or the like into desired configurations.

To better understand the fingers 48, turn to FIG. 4. Fingers 48 are continuous with the first leg portion 44 of the body 42. Each finger 48 includes a bowed portion 52 extending inward beneath the second leg portion 46. The bowed portion 52 is of a desired radius such that the apex 54 of the arc of the bow is adapted to contact the electrical components 24 to maintain the components 24 against the heat sink wall 26, as seen in FIG. 4. An end portion 56 is continuous with the bowed portion 52 of the fingers 48. The end portion 56 continues the arc of the bowed portion 52. The configuration and positioning of the fingers 48 provide a desired force to be exerted against the electrical components 24 to maintain the electrical components 24 against the housing or sink wall 26 when the spring 10 is in an assembled position, as seen in FIGS. 2 through 4.

The fingers 48 extend from the first leg portion of the body member 44 at desired positions along the length of the body 42. Generally, the fingers 48 are positioned such that gaps 58 are formed between adjacent fingers. The gaps 58 generally have substantially the same widths to provide equal spacing of the fingers along the body.

The flange 50 is continuous with the second leg portion 46 of the body 42. The flange 50 extends from the second leg portion 46 opposing the first leg portion 44 and is at a substantially right angle with respect to the second leg portion 46. The flange 50 extends over the wall 26 of the housing to provide positioning of the spring 10 on the housing wall 26. Also, the flange 50 enables the spring 10 to attach itself to the housing wall in a clip-like fashion over the edge of the housing wall 26. This attachment provides a solid foundation to enable spring force to be applied to the electrical components 24 by the fingers 48.

A pair of apertures 60 and 62 are formed at the junction of the second leg portion 46 and flange 50. The apertures 60 and 62 enable passage of wedges 14 to position the spring with the heat sink. The pair of wedges 14 include a body portion 70 and an angled portion 72 and rounded tip 74. The pair of wedges 14 are positioned through the apertures 60 and 62 and are pushed downward to load the spring which, in turn, tensions the fingers to clamp against the electrical devices as best seen in FIG. 4.

Load spring 12, which is positioned on an inner wall 27, is similar to spring 10. The spring 12 includes an elongated body 74 having a pair of edges 76 and 78. A plurality of biasing fingers 82 extend from the first edge 76. A plurality of retaining arms 84 for receiving wedge 16 extend from the second edge 78. The spring 12 is unitarily formed or stamped from a spring steel material and may be stamped, rolled, formed or the like into desired configurations.

Fingers 82 are continuous with the first leg edge 76 and extend downward therefrom. Each finger 82 includes an angled portion 86 extending inward beneath the body 74. The angled finger includes an angled end portion 88, which angles outwardly forming an obtuse angle with finger angle portion 86, at the end of the finger as seen in FIG. 4. The configuration and positioning of the fingers provide a desired force to be exerted against electrical components 24 to maintain the electrical components 24 against the housing wall 27 when the spring 12 is in an assembled position, as seen in FIGS. 2 through 4. Generally, the fingers are positioned such that gaps 90 are formed between adjacent fingers. The gaps 90 generally have substantially the same width to provide equal spacing of the fingers along the body.

The arms 84 include a shoulder 96 and extending fingers 98. The shoulder 86 extends from the second edge 78. Each shoulder 96 includes an aperture 92 to enable passage of the wedge 16. The extending fingers 98 extend downward and angle inward beneath the shoulder 96. The fingers 98 also include an angled end 94 which angles outwardly forming an obtuse angle with the finger 98. The vertices abut the wedge 16 and provide a loading force to fingers 82 to apply force on the electric components.

The wedge 16 has a body portion 100 with extending legs 102. The legs have an angled portion 104 and a rounded tip 106. The legs are spaced a desired distance from one another such that they will provide sufficient force against the arms 84 to load the fingers 82. The wedge legs 102 are positioned through the aperture 92 and spring 12. The legs 102 abut against the arms 84 to move them away from the wall 27 to provide a clamping force in the fingers 82 to maintain the electrical components 24 against the wall 27, as seen in FIG. 4.

While the above detailed description describes the preferred embodiment of the present invention, the invention is susceptible to modification, variation, and alteration without deviating from the scope and fair meaning of the subjoined claims.

What is claimed is:

1. A load spring assembly for a heat sink assembly including a heat sink housing comprising:
    an elongated body member;
    one or more biasing members extending from said body member, said one or more biasing members adapted for contacting electrical components to be secured in the heat sink assembly; and
    wedge means adapted for securing the load spring assembly to the heat sink housing, said wedge means being adapted to be received within an aperture formed in the load spring assembly and to abut a portion of the heat sink housing to position the load spring assembly with respect to the heat sink housing.

2. The load spring according to claim 1 wherein said one or more biasing members each include a portion for contacting the electrical components.

3. The load spring assembly according to claim 1 wherein said wedge means adapted for contacting a wall of the heat sink housing to position the load spring on the heat sink housing and provide a retaining force in said biasing members.

4. A load spring assembly for a heat sink assembly including a heat sink housing comprising:
    an elongated body member having one or more apertures;
    a plurality of fingers extending from said body members, said plurality of fingers including a portion adapted for contacting electrical components to maintain the electrical components abutted against the heat sink housing; and
    one or more wedge members, said one or more wedge members adapted to move through said one or more apertures to engage a wall of the heat sink housing for positioning the load spring with respect to the heat sink housing and to load said fingers to apply a clamping force on the electrical components.

5. The load spring assembly according to claim 4 wherein said plurality of fingers each have a free extending end adapted to contact a carrier member.

6. The load spring assembly according to claim 4 wherein one or more members extend from an opposing side of said plurality of fingers on said body member, said one or more members providing a contact surface for said one or more wedge members.

7. A load spring assembly for a heat sink assembly including a heat sink housing comprising:
    an elongated body member having a first and second edge portion;
    a plurality of fingers extending from said first edge portion of said body member and at least one arm member extending from the second edge portion, said fingers having a portion extending inward adapted for contacting electrical components for maintaining the electrical components in contact with the heat sink housing; and
    one or more wedge members for retaining said load spring assembly in position on the heat sink housing, said one or more wedge members adapted to abut between a wall of the heat sink housing and said at least one arm member.

8. The load spring assembly according to claim 7 wherein said at least one wedge member includes a plurality of extending legs.

9. The load spring assembly according to claim 8 wherein said at least one arm member includes a plurality of apertures for receiving said extending legs.

10. The load spring assembly according to claim 8 wherein said extending legs include an angled portion and a rounded tip.

* * * * *